(12) United States Patent
Zhang

(10) Patent No.: US 11,948,650 B2
(45) Date of Patent: Apr. 2, 2024

(54) TESTING CIRCUIT, TESTING DEVICE AND TESTING METHOD THEREOF

(71) Applicant: CHANGXIN MEMORY TECHNOLOGIES, INC., Anhui (CN)

(72) Inventor: Liang Zhang, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 17/453,846

(22) Filed: Nov. 6, 2021

(65) Prior Publication Data
US 2022/0068416 A1 Mar. 3, 2022

Related U.S. Application Data

(63) Continuation of application No. PCT/CN2021/100887, filed on Jun. 18, 2021.

(30) Foreign Application Priority Data

Aug. 31, 2020 (CN) .......................... 202010892968.5

(51) Int. Cl.
G11C 29/10 (2006.01)
G01R 29/02 (2006.01)
G11C 7/10 (2006.01)
G11C 29/02 (2006.01)
G11C 29/12 (2006.01)
(Continued)

(52) U.S. Cl.
CPC ............ G11C 29/10 (2013.01); G01R 29/023 (2013.01); G11C 7/106 (2013.01); G11C 7/1087 (2013.01); G11C 29/023 (2013.01); G11C 29/12015 (2013.01); G11C 29/36 (2013.01); G11C 29/46 (2013.01); G11C 2029/3602 (2013.01)

(58) Field of Classification Search
CPC ....... G11C 29/10; G11C 7/106; G11C 7/1087; G11C 29/023; G11C 29/12015; G11C 29/36; G11C 29/46; G11C 2029/3602; G01R 29/023
USPC .......................................... 714/731, 718, 744
See application file for complete search history.

(56) References Cited

U.S. PATENT DOCUMENTS 4,890,270 A 12/1989 Griffith
5,083,299 A 1/1992 Schwanke
(Continued)

FOREIGN PATENT DOCUMENTS

CN 103809025 A 5/2014
CN 106443179 A 2/2017
(Continued)

OTHER PUBLICATIONS

First Office Action of the Chinese application No. 202010892968.5, dated Jun. 20, 2022.
(Continued)

Primary Examiner — John J Tabone, Jr.
(74) Attorney, Agent, or Firm — Syncoda LLC; Feng Ma

(57) ABSTRACT

A testing circuit includes: a first sampling module configured to receive a to-be-tested pulse signal, and generate a first sampled signal according to the pulse signal; and a second sampling module configured to receive the pulse signal, and generate a second sampled signal according to the pulse signal. The second sampled signal and the first sampled signal have a phase difference, the phase difference being equal to a pulse width of the pulse signal.

18 Claims, 9 Drawing Sheets

(51) Int. Cl.
*G11C 29/36* (2006.01)
*G11C 29/46* (2006.01)

(56) References Cited

U.S. PATENT DOCUMENTS

| | | | | |
|---|---|---|---|---|
| 6,710,637 | B1* | 3/2004 | Chan | H03K 5/00006 |
| | | | | 327/239 |
| 6,720,810 | B1 | 4/2004 | New | |
| 8,874,999 | B1 | 10/2014 | Taylor | |
| 9,541,591 | B2 | 1/2017 | Darbinyan et al. | |
| 9,608,642 | B1* | 3/2017 | Si | H03K 5/134 |
| 2008/0094113 | A1* | 4/2008 | Kuan | H03K 23/68 |
| | | | | 327/117 |
| 2008/0143402 | A1 | 6/2008 | Huang | |
| 2010/0061499 | A1* | 3/2010 | Mijuskovic | H03D 13/004 |
| | | | | 375/375 |
| 2010/0134162 | A1 | 6/2010 | Kondou | |
| 2013/0077430 | A1* | 3/2013 | Na | G11C 29/023 |
| | | | | 365/233.11 |
| 2013/0176151 | A1* | 7/2013 | Min | H03M 9/00 |
| | | | | 341/101 |
| 2016/0041212 | A1 | 2/2016 | Darbinyan et al. | |
| 2017/0163268 | A1 | 6/2017 | Maeda | |
| 2018/0090095 | A1* | 3/2018 | Jeon | G09G 3/20 |
| 2019/0165675 | A1* | 5/2019 | Pyun | G09G 3/3648 |
| 2022/0068416 | A1* | 3/2022 | Zhang | G11C 29/10 |
| 2022/0068419 | A1* | 3/2022 | Zhang | G11C 29/14 |

FOREIGN PATENT DOCUMENTS

| | | |
|---|---|---|
| CN | 106569032 A | 4/2017 |
| CN | 106597122 A | 4/2017 |
| CN | 106707034 A | 5/2017 |
| CN | 110082593 A | 8/2019 |
| CN | 209656779 U | 11/2019 |
| JP | H07280857 A | 10/1995 |
| JP | H11220367 A | 8/1999 |
| JP | 2011153971 A | 8/2011 |

OTHER PUBLICATIONS

International Search Report in the international application No. PCT/CN2021/100887, dated Aug. 27, 2021.
First Office Action of the Japanese application No. 2022-551012, dated Sep. 26, 2023. 12 pages with English translation.
Supplementary European Search Report in the European application No. 21859809.2, dated Jan. 19, 2024. 10 pages.
Ryo Harada et al., "Impact of NBTI-Induced Pulse-Width Modulation on SET Pulse-Width Measurement", IEEE Transactions on Nuclear Science, vol. 60, No. 4, Aug. 2013, the whole document. 5 pages.
First Office Action of the Korean application No. 10-2022-7028844, dated Jan. 29, 2024. 12 pages with English translation.

* cited by examiner

TESTING CIRCUIT, TESTING DEVICE AND TESTING METHOD THEREOF

CROSS-REFERENCE TO RELATED APPLICATIONS

This is a continuation of International Application No. PCT/CN2021/100887 filed on Jun. 18, 2021, which claims priority to Chinese Patent Application No. 202010892968.5 filed on Aug. 31, 2020. The disclosures of these applications are hereby incorporated by reference in their entirety.

BACKGROUND

A memory is a device configured to store data. The memory usually includes multiple storage arrays, and each storage array includes multiple memory cells. The memory cells serve as basic unit structures for storing data, and each memory cell has a data storage function.

SUMMARY

The disclosure relates to a testing circuit, a testing device and a testing method thereof.

According to some embodiments, a first aspect of the disclosure provides a testing circuit, including: a first sampling module, configured to receive a to-be-tested pulse signal, and generate a first sampled signal according to the pulse signal; and a second sampling module, configured to receive the pulse signal, and generate a second sampled signal according to the pulse signal, where the second sampled signal and the first sampled signal have a phase difference, the phase difference being equal to a pulse width of the pulse signal.

According to some embodiments, a second aspect of the disclosure provides a testing device, including: the above-mentioned testing circuit; and an analysis circuit, connected with the testing circuit, and configured to obtain a width of a pulse signal according to the first sampled signal and the second sampled signal.

According to some embodiments, a third aspect of the disclosure provides a testing method performed by a testing device including a first sampling circuit, a second sampling circuit and an analysis circuit. The method includes: the first sampling circuit and the second sampling circuit receive a to-be-tested pulse signal; the first sampling circuit and the second sampling circuit generate a first sampled signal and a second sampled signal according to the pulse signal respectively; and the analysis circuit obtains the first sampled signal and the second sampled signal, and obtains a width of the pulse signal according to the first sampled signal and the second sampled signal, where the second sampled signal and the first sampled signal have a phase difference, the phase difference being equal to a pulse width of the pulse signal.

Details of one or more embodiments of the disclosure will be proposed in the following drawings and descriptions. Other features and advantages of the disclosure will become apparent from the description, the accompanying drawings and the claims.

BRIEF DESCRIPTION OF THE DRAWINGS

In order to more clearly illustrate the technical solutions of embodiments of the disclosure or the traditional technology, the accompanying drawings required for describing the embodiments or the traditional technology will be briefly introduced below. It is apparent that the accompanying drawings in the following description show only some embodiments of the disclosure, and those of ordinary skill in the art may still derive other drawings from these accompanying drawings without creative efforts.

DESCRIPTION OF ELEMENT REFERENCE NUMERALS

Figure 1:
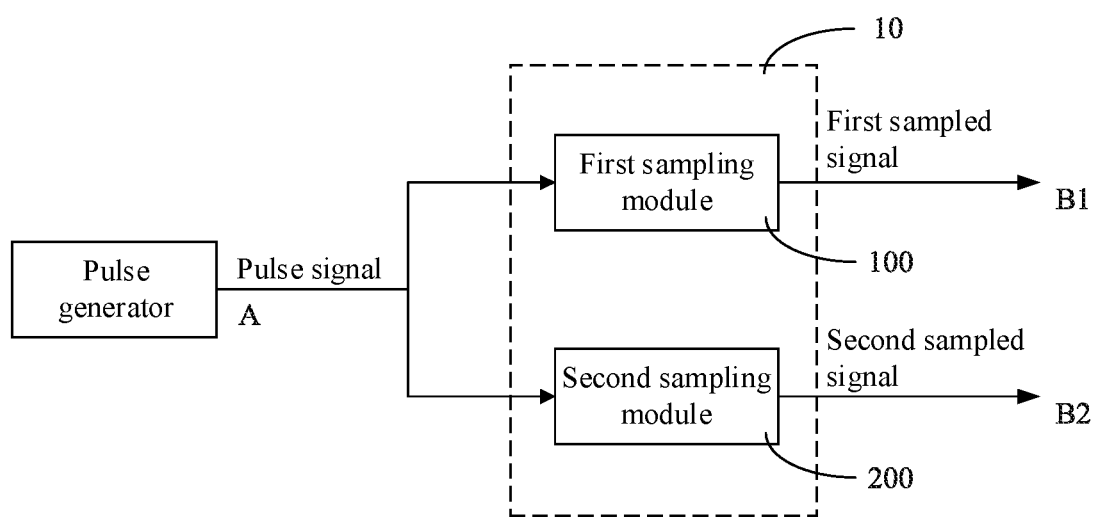
FIG. 1 illustrates a schematic structural diagram of a testing circuit of a first embodiment.

Testing circuit: 10; transmission gate: 210; second sampling module: 200; second inverter: 130; second temporary storage unit: 220; third inverter: 140; fourth inverter: 230; fifth inverter: 240; first sampling module: 100; first inverter: 120; first temporary storage unit: 110; and analysis circuit: 20.

DETAILED DESCRIPTION

When reading and writing the memory, it needs to be controlled by a pulse signal. Exemplarily, the pulse signal may be configured to control a transistor pair connected to a word line to be on or off. Specifically, when the pulse signal is valid, reading or writing operations are performed on the memory cells, and when the pulse signal fails, the storage units maintain the original data. As the requirements for the reading and writing speed of the memory continue to be higher, it is necessary to further increase a transmission frequency of the pulse signal and reduce a pulse width. In order to ensure the reliability of the pulse signal, it is necessary to test the pulse width through a testing circuit to ensure that the generated pulse signal is the same as a designed signal.

With the continuous narrowing of a pulse width, higher requirements are raised for a testing circuit and a testing device of the pulse width, and an existing testing circuit can no longer accurately test the narrowing pulse width.

In order to facilitate the understanding of embodiments of the disclosure, the embodiments of the disclosure will be described in a more comprehensive manner with reference to related drawings. Preferred embodiments of the embodiments of the disclosure are shown in the accompanying drawings. The embodiments of disclosure may, however, be embodied in many different forms which are not limited to the embodiments described herein. Rather, these embodiments are provided so that the disclosure of the embodiments of the disclosure will be more thorough and complete.

Unless defined otherwise, all technical and scientific terms used herein have the same meaning as commonly understood by those skilled in the art to which the embodiments of the disclosure belong. The terms used herein in the specification of the embodiments of the disclosure are for the purpose of describing specific embodiments only and are not intended to be limiting of the embodiments of the disclosure. The term "and/or" as used herein includes any and all combinations of one or more related listed items.

In the description of the embodiments of the disclosure, it is to be understood that directions or positional relationships indicated by the terms "upper", "lower", "vertical", "horizontal", "inner", and "outer" are the directions or positional relationships based on the accompanying drawings. They are only for the convenience of describing the embodiments of the disclosure and simplifying the description, rather than indicating or implying that a device or element referred to must have a specific orientation or be constructed and operated in a specific orientation, and therefore cannot be understood as restrictions on the embodiments of the application.

FIG. 1 illustrates a schematic structural diagram of a testing circuit 10 of a first embodiment. The testing circuit 10 is configured to process a to-be-tested pulse signal and obtain a pulse width of the to-be-tested pulse signal through the processed signal. With reference to FIG. 1, the testing circuit includes a first sampling module 100 and a second sampling module 200, which may be sampling sub-circuits.

The first sampling module 100 is configured to receive the to-be-tested pulse signal, and generate a first sampled signal according to the pulse signal.

The to-be-tested pulse signal is generated by a pulse generator and is divided into at least two paths. One path of the pulse signal is transmitted to the testing circuit 10 for testing, and the other path of the pulse signal is transmitted to a storage array to control data reading and writing of the storage array. The to-be-tested pulse signal includes at least one pulse, and the pulse width of the pulse signal refers to a duration of a high level of the pulse. When the pulse signal includes the plurality of pulses, pulse widths of the plurality of pulses may be the same or different.

In particular, taking one pulse as an example for description, it is understandable that a signal with a certain pulse width must have a rising edge and a falling edge, and a time interval between the rising edge moment and the falling edge moment is the pulse width. Generating the first sampled signal according to the pulse signal refers to generating the first sampled signal in response to a level change of the pulse signal, that is, generating the first sampled signal in response to the rising edge or the falling edge of the pulse signal.

The second sampling module 200 is configured to receive the pulse signal, and generate a second sampled signal according to the pulse signal.

In particular, the first sampling module 100 generates the first sampled signal in response to one of the rising edge and the falling edge of the pulse signal, and the second sampling module 200 generates the second sampled signal in response to the other of the rising edge and the falling edge of the pulse signal. The second sampled signal and the first sampled signal have a phase difference. For example, the first sampled signal and the second sampled signal may have a same signal waveform, but the phase difference exists in timing between the two, that is, if one of the first sampled signal and the second sampled signal is delayed corresponding to the phase difference, the signal may coincide with the other signal. According to a generation principle of the first sampled signal and the second sampled signal, the phase difference is equal to the pulse width of the pulse signal.

Therefore, the pulse width of the pulse signal may be further obtained according to the first sampled signal and the second sampled signal.

In the embodiment, the testing circuit 10 includes: the first sampling module 100 configured to receive the to-be-tested pulse signal and generate the first sampled signal according to the pulse signal, and the second sampling module 200 configured to receive the pulse signal and generate the second sampled signal according to the pulse signal, in which the second sampled signal and the first sampled signal have a phase difference, the phase difference being equal to the pulse width of the pulse signal. In the embodiment, two sampled signals are generated based on one pulse signal, that is, the pulse signal with a narrow pulse width is split into the first sampled signal and the second sampled signal that are easier to identify and calculate, so as to reduce the requirement for testing speed and testing accuracy of a subsequent analysis circuit 20 and to provide the testing circuit 10 with higher accuracy.

Further, by generating the first sampled signal and the second sampled signal with the same waveform, the difficulty of identifying the first sampled signal and the second sampled signal may be reduced, thereby improving the testing accuracy. Exemplarily, the first sampled signal and the second sampled signal may both be square wave signals, and have a same signal amplitude, frequency and duty cycle, so that phase information may be obtained by identifying the rising edges or the falling edges of the first sampled signal and the second sampled signal. The first sampled signal and the second sampled signal may also be sine wave signals and have the same signal amplitude and frequency, so that the phase information may be obtained by identifying peaks or valleys of the first sampled signal and the second sampled signal. In other examples, the first sampled signal and the second sampled signal may also be signals of other waveforms such as triangle waves, sawtooth waves, etc. The embodiment of the disclosure does not specifically limit the waveforms thereof.

Furthermore, even if the signal waveforms of the first sampled signal and the second sampled signal are different, as long as the first sampled signal and the second sampled signal are both generated based on the input pulse signal, and the phase information of the first sampled signal and the second sampled signal may be obtained through the analysis circuit 20 so that the pulse width may be obtained by analyzing the two pieces of phase information, the sampled signals also belong to the protection scope of the disclosure.

In one of the embodiments, the first sampling module 100 generates the first sampled signal in response to the falling edge of the pulse signal, and the second sampling module 200 generates the second sampled signal in response to the rising edge of the pulse signal.

Figure 2:
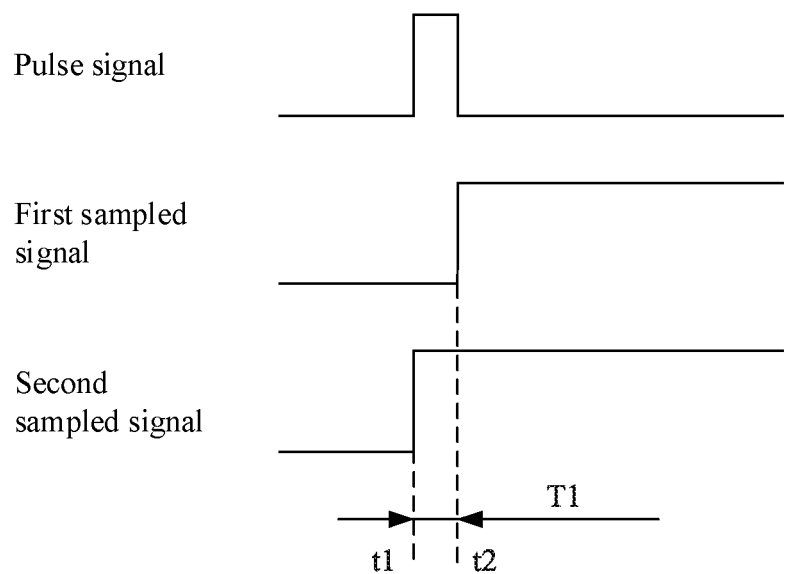
FIG. 2 illustrates a signal timing diagram of an embodiment.

In particular, FIG. 2 illustrates a signal timing diagram of an embodiment. With reference to FIG. 2, in the embodiment, the pulse signal includes one pulse, and initial states of the first sampled signal and the second sampled signal are both 0. The state of the first sampled signal is switched in response to the falling edge of the pulse signal, that is, the state is switched from a state '0' to a state '1', and the state of the first sampled signal is switched at moment t2. The state of the second sampled signal is switched in response to the rising edge of the pulse signal, that is, the state is switched from the state '0' to the state '1', and the state of the second sampled signal is switched at moment t1. In the embodiment, a time interval between t1 and t2 is the pulse width T1. In the embodiment, the pulse width may be obtained through calculation by obtaining the switching moments of the two signals without the need to sample the rising and falling edges of the same pulse with a very short time interval through a testing machine, thereby reducing the requirements for response speed of the testing machine and improving testing accuracy of the pulse width.

In one of the embodiments, a first delay time of the first sampling module 100 on a transmission path is equal to a second delay time of the second sampling module 200 on a data transmission path. With further reference to FIG. 1, an output terminal of the pulse generator is defined as A, the first sampled signal and the second sampled signal are transmitted to the same analysis circuit 20 for analysis, a port of the analysis circuit 20 for receiving the first sampled signal is defined as B1, a port of the analysis circuit 20 for receiving the second sampled signal is defined as B2, and then the first delay time is a transmission time of the signal on a path AB, while the second delay time is a transmission time of the signal on a path AB2. Exemplarily, elements with similar data processing and transmission time may be arranged in the first sampling module 100 and the second sampling module 200, so that the first delay time and the second delay time are equal. In the embodiment, by setting the delay time to be equal, the synchronization of the first sampled signal and the second sampled signal may be improved, thereby reducing the influence of difference in signal reception moments on a testing result. It is to be noted that considering actual circuit conditions, the above-mentioned time equality does not mean absolute equality, but a certain error is allowed, as long as the error has a small impact on a pulse width test, such as a 1% error.

Figure 3:
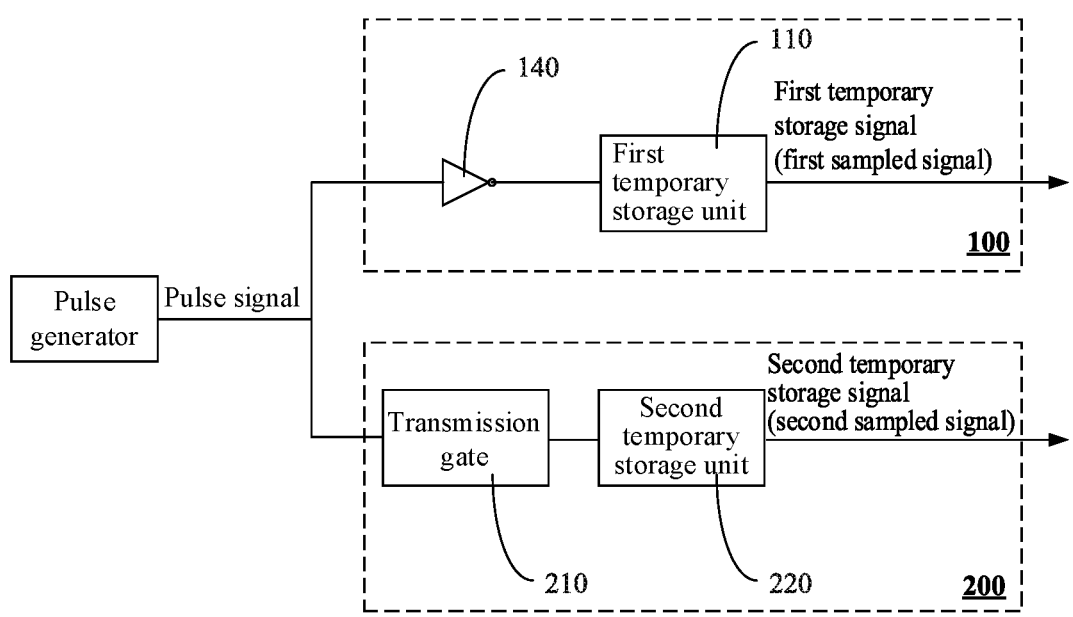
FIG. 3 illustrates a schematic structural diagram of a testing circuit of a second embodiment.

FIG. 3 illustrates a schematic structural diagram of a testing circuit 10 of a second embodiment. With reference to FIG. 3, in this embodiment, a first sampling module 100 includes: a first temporary storage unit 110 configured to sample a first to-be-sampled signal in response to a pulse signal so as to generate a first temporary storage signal. A triggering type of the temporary storage unit 110 is edge triggering, and an edge of the first temporary storage signal corresponds to a first edge of the pulse signal and corresponds to an edge of a first sampled signal. The first temporary storage unit 110 includes one or more of a trigger, a latch or a register.

In the embodiment, the first temporary storage unit 110 may sample and latch an edge of the pulse signal, so as to accurately and stably output the first temporary storage signal. Further, since the edge of the first temporary storage signal corresponds to the first edge (for example, a falling edge) of the pulse signal, the first temporary storage signal may be output as the first sampled signal and a pulse width of the input pulse signal may be analyzed. It can be understood that, in order to make a first delay time and a second delay time equal, a second temporary storage unit 220 may be arranged in a second sampling module 200, and the structure of the second temporary storage unit 220 is of the same structure as the first temporary storage unit 110, so that the synchronization of the signals and the accuracy of a testing result are improved.

In one of the embodiments, the first sampling module 100 further includes: a third inverter 140. An input terminal of the third inverter 140 is connected to the pulse signal, an output terminal of the third inverter 140 is connected to a drive terminal of the first temporary storage unit 110, and the third inverter 140 is configured to receive the pulse signal and output an inverted pulse signal to the first temporary storage unit 110.

In order to realize that sampling edges of the first temporary storage unit 110 and the second temporary storage unit 220 are different, on the one hand, response setting may be made in internal structures of the temporary storage units, that is, exemplarily, the first temporary storage unit 110 is made to respond to the falling edge and the second temporary storage unit 220 is made to respond to a rising edge. On the other hand, the internal structures of the first temporary storage unit 110 and the second temporary storage unit 220 may also be completely the same, and sampling of different edges may be realized by changing input signals. That is, exemplarily, the first temporary storage unit 110 and the second temporary storage unit 220 are both made to respond to the rising edge, but the third inverter 140 is arranged in front of the first temporary storage unit 110; and after the input pulse signal passes the third inverter 140, an original state '0' is inverted into '1' and an original state '1' is inverted into '0', so that the rising edge in the original signal is converted into a falling edge, and the falling edge in the original signal is converted a rising edge. Through the above-mentioned structure of this embodiment, the first temporary storage unit 110 may sample the rising edge of the inverted pulse signal, but actually sample the falling edge of the pulse signal, and previously the second temporary storage unit 220 is not connected to the inverter, so that sampling of different edges of the first temporary storage unit 110 and the second temporary storage unit 220 is realized.

Further, in order to make the first delay time the same as the second delay time, a transmission gate 210 may be arranged on a data transmission path of the second temporary storage unit 220, and a delay time of the transmission gate 210 is equal to a delay time of the third inverter 140. In the embodiment shown in FIG. 3, the transmission gate 210 is arranged between the pulse generator and the second temporary storage unit 220. In other embodiments, an output terminal of the transmission gate 210 may also be connected to the second temporary storage unit 220, and the effect of the above equal delay time may still be realized.

Figure 4:
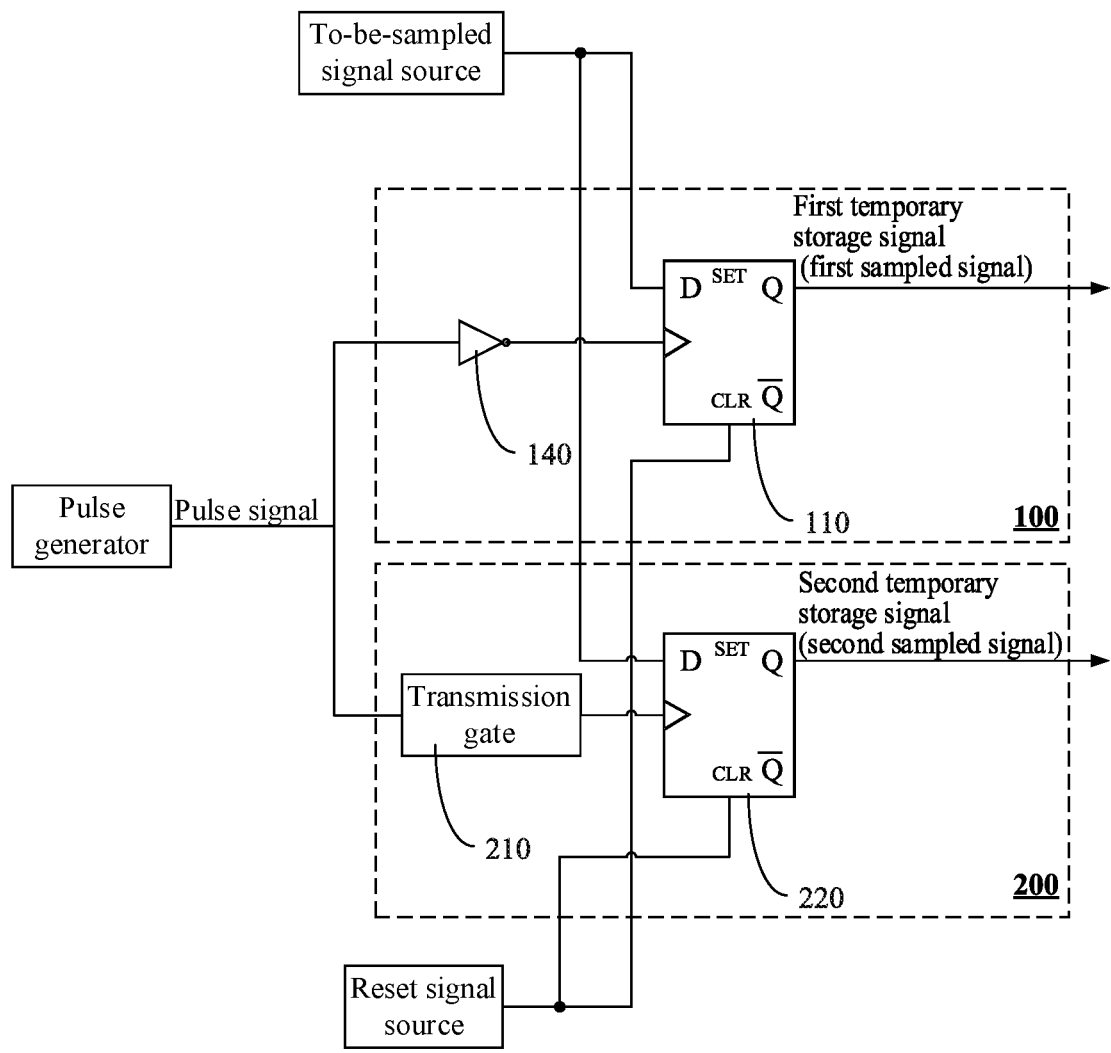
FIG. 4 illustrates a schematic structural diagram of a testing circuit of a third embodiment.

FIG. 4 illustrates a schematic structural diagram of a testing circuit 10 of a third embodiment. With reference to FIG. 4, in the embodiment, a first temporary storage unit 110 and a second temporary storage unit 220 are both D triggers, input terminals of the first temporary storage unit 110 and the second temporary storage unit 220 are both connected to a same to-be-sampled signal source, reset terminals of the first temporary storage unit 110 and the second temporary storage unit 220 are both connected to a reset signal source, a drive terminal of the first temporary storage unit 110 is connected to an inverted pulse signal, and a drive terminal of the second temporary storage unit 220 is connected to a pulse signal. In particular, the to-be-sampled signal source has a constant output. In the embodiment, the to-be-sampled signal source may output a high level constantly. When a reset signal output by the reset signal source is enabled, the first temporary storage unit 110 and the second temporary storage unit 220 both output a state '0'; when the reset signal output by the reset signal source is not enabled, the first temporary storage unit 110 and the second temporary storage unit 220 sample a to-be-sampled signal in response to signals input by the drive terminals respectively, and therefore are switched to output a state '1' respectively at different moments.

In other embodiments, the reset signal source may also be replaced with a setting signal source, set terminals of the first temporary storage unit 110 and the second temporary storage unit 220 are both connected to the setting signal source, and the to-be-sampled signal source constantly outputs a low level. Similar to the previous embodiment, when a setting signal output by the setting signal source is enabled, the first temporary storage unit 110 and the second temporary storage unit 220 both output the state '1'; and when the setting signal output by the setting signal source is not enabled, the first temporary storage unit 110 and the second temporary storage unit 220 sample the to-be-sampled signal in response to signals input by the drive terminals respectively, and therefore are switched to output the state '0' respectively at different moments.

Figure 5:
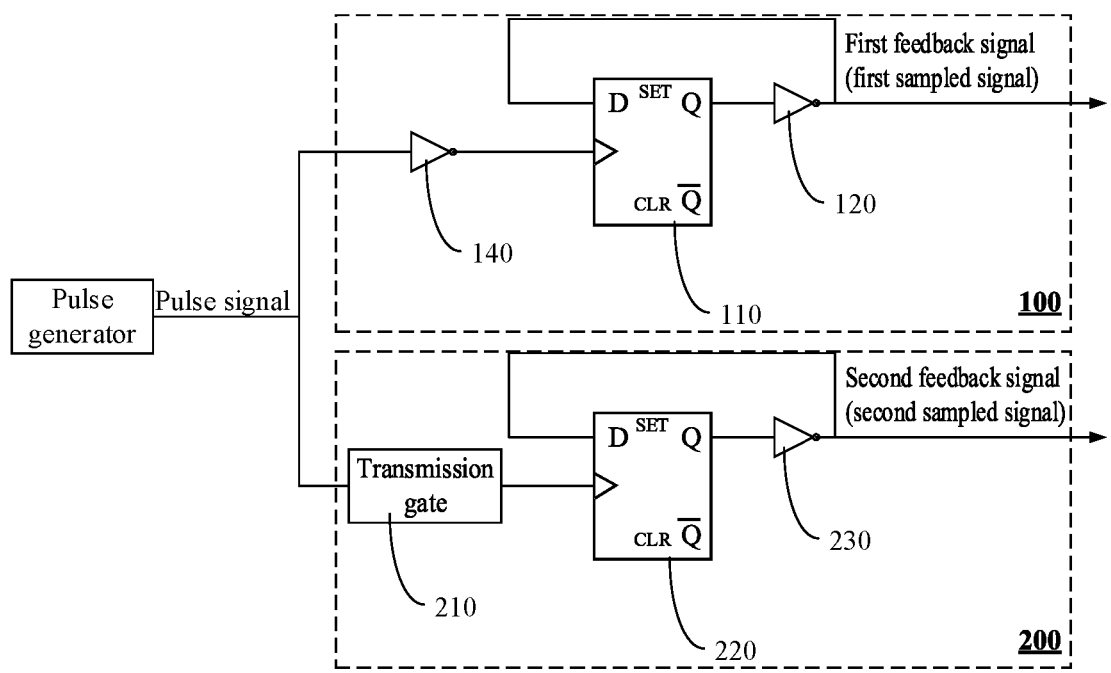
FIG. 5 illustrates a schematic structural diagram of a testing circuit of a fourth embodiment.

FIG. 5 illustrates a schematic structural diagram of a testing circuit 10 of a fourth embodiment. With reference to FIG. 5, in the embodiment, a first sampling module 100 further includes: a first inverter 120, which forms a first feedback loop together with a first temporary storage unit 110; and the first feedback loop is configured to respond to a pulse signal and generate a first feedback signal, and an edge of the first feedback signal corresponds to a first edge of the pulse signal. It is understandable that the testing circuit 10 provided in the preceding embodiment needs to continuously switch signals input by a reset signal source so that test pulse widths of multiple consecutive pulses can be tested, and the switching of reset signals needs to be matched with arrival times of pulses so that the pulse widths can be accurately tested.

Specifically, an input terminal of the first inverter 120 is connected to an output terminal of the first temporary storage unit 110, an output terminal of the first inverter 120 is connected to an input terminal of the first temporary storage unit 110, and the first inverter 120 is configured to invert a first temporary storage signal so as to generate the first feedback signal.

Figure 6:
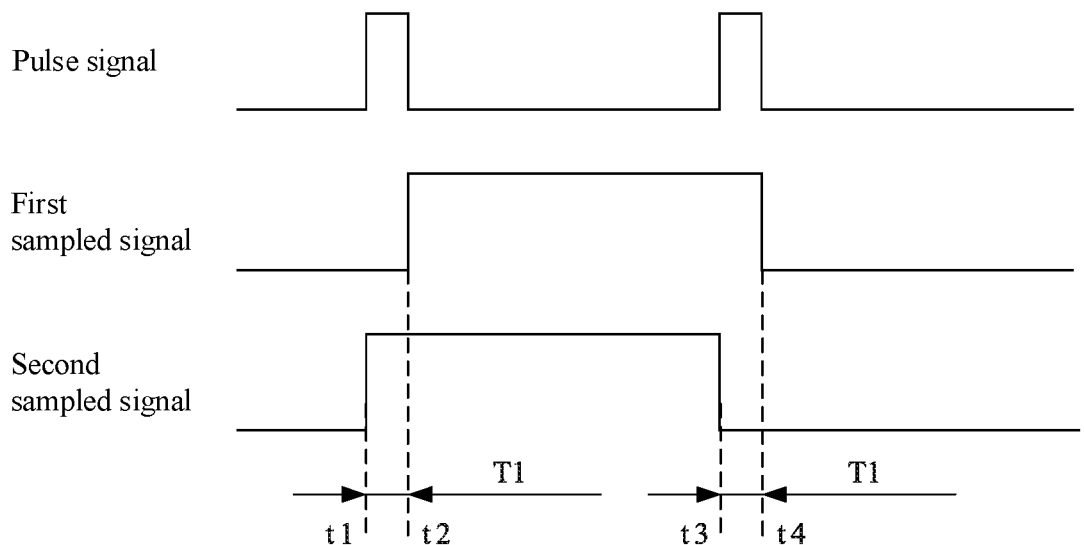
FIG. 6 illustrates a signal timing diagram of another embodiment.

In the embodiment, the first feedback loop is formed by the first temporary storage unit 110 and the first inverter 120, and feedback is made through the first feedback signal, so that the first sampling module 100 in the testing circuit 10 may realize automatic switching and testing. Correspondingly, a fourth inverter 230 is also arranged in a second sampling unit, so that a second temporary storage unit 220 and the fourth inverter 230 jointly form a second feedback loop, thereby realizing automatic switching and testing of a second sampling module 200. Further, FIG. 6 is a signal timing diagram of another embodiment. With reference to FIG. 6, an edge of the first feedback signal may correspond to a falling edge of the pulse signal, and an edge of a second feedback signal may correspond to a rising edge of the pulse signal, and the first feedback signal is output as a first sampled signal while the second feedback signal is output as a second sampled signal.

Figure 7:
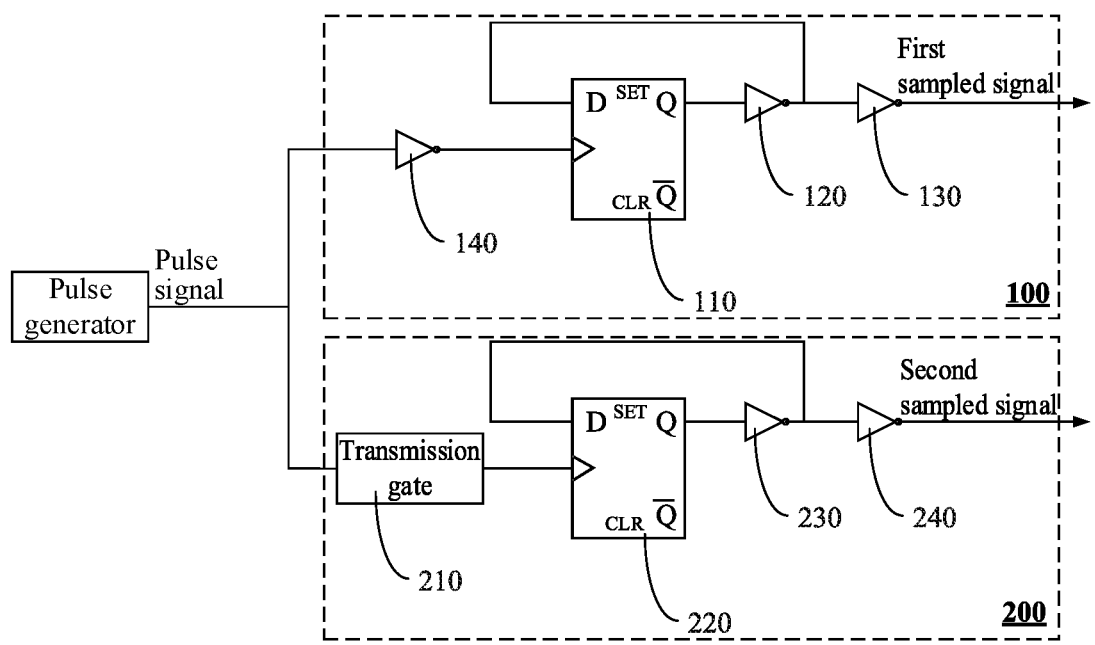
FIG. 7 illustrates a schematic structural diagram of a testing circuit of a fifth embodiment.

FIG. 7 illustrates a schematic structural diagram of a testing circuit 10 of a fifth embodiment. With reference to FIG. 7, in the embodiment, a first sampling module 100 further includes: a second inverter 130, an input terminal of the second inverter 130 is connected with an output terminal of a first inverter 120, and the second inverter 130 is configured to receive a first feedback signal and generate a first sampled signal according to the first feedback signal. In the embodiment, by arranging the second inverter 130, a switching mode of the first sampled signal may be made to correspond to a switching mode of a signal output by a first temporary storage unit 110.

With further reference to FIG. 7, in the embodiment, a second sampling module includes a transmission gate 210, a second temporary storage unit 220, a fourth inverter 230 and a fifth inverter 230, in which an input terminal of the transmission gate 210 is connected with a pulse signal, an output terminal of the transmission gate 210 is connected with a drive terminal of the second temporary storage unit 220 and the transmission gate 210 is configured to transmit the pulse signal to the second temporary storage unit 220;

an input terminal of the second temporary storage unit 220 is connected with an output terminal of the fourth inverter 230, the second temporary storage unit 220 is configured to sample a signal output by the fourth inverter 230 in response to the pulse signal so as to generate a second temporary storage signal and an edge of the second temporary signal corresponds to a second edge of the pulse signal;

the fourth inverter 230 is configured to inverting the second temporary signal so as to generate a second feedback signal; and an input terminal of the fifth inverter 240 is connected with an output terminal of the fourth inverter 230, and the fifth inverter 240 is configured to receive the second feedback signal and generate a second sampled signal according to the second feedback signal.

In particular, the first temporary storage unit 110 corresponds to the second temporary storage unit 220, the first inverter 120 corresponds to the fourth inverter 230, the second inverter 130 corresponds to the fifth inverter 240, and the third inverter 140 corresponds to the transmission gate 210. Therefore, the second sampling module 200 of the embodiment may refer to the implementation of the first sampling module 100 described above, which will not be repeated here.

Figure 8:
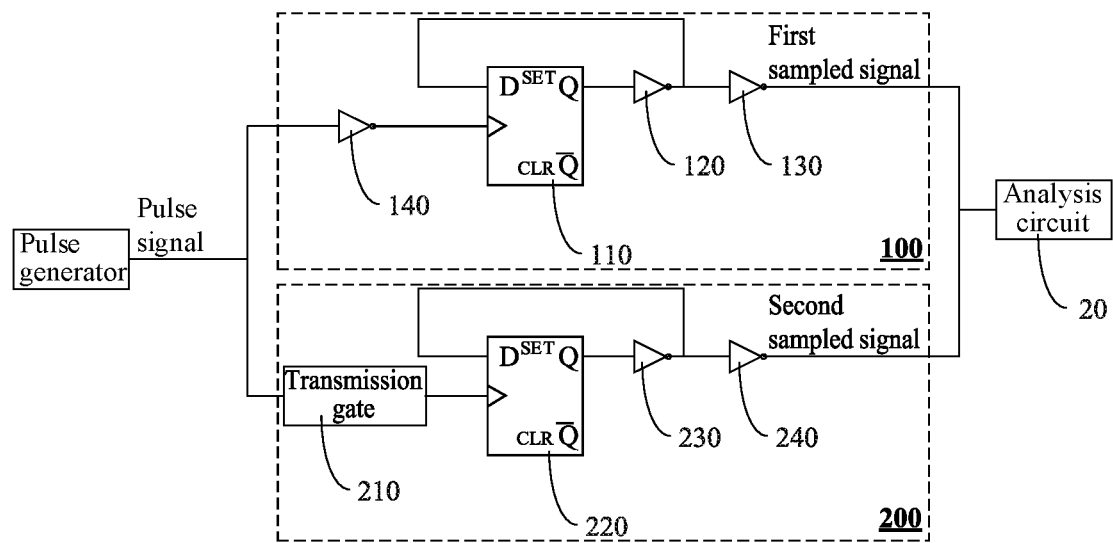
FIG. 8 illustrates a schematic structural diagram of a testing device of an embodiment.

FIG. 8 illustrates a schematic structural diagram of a testing device of an embodiment. With reference to FIG. 8, in the embodiment, the testing device includes: the above-mentioned testing circuit 10; and an analysis circuit 20 connected with the testing circuit 10 and configured to obtain a width of a pulse signal according to the first sampled signal and the second sampled signal. For the specific limitation of the testing circuit 10, reference may be made to the above limitation, which will not be repeated here. In the embodiment, the testing device realizing accurate pulse width tests is realized by the testing circuit 10 and the analysis circuit 20.

Figure 9:
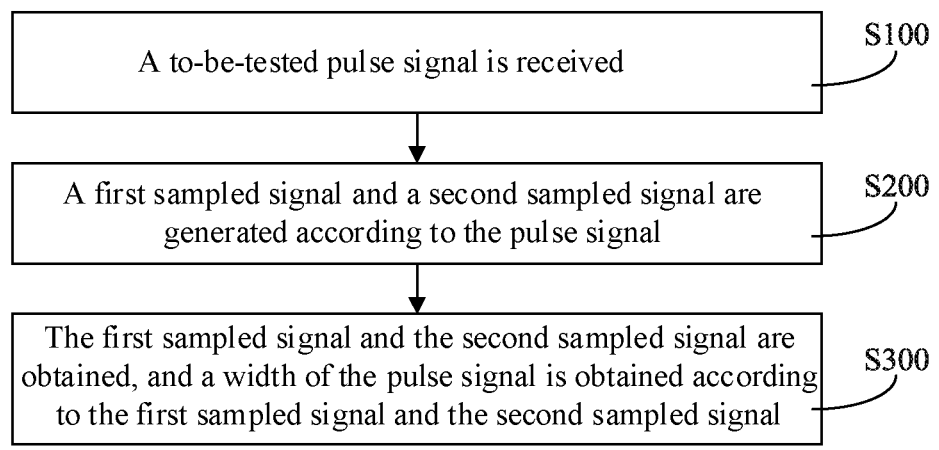
FIG. 9 illustrates a flow chart of a testing method of an embodiment.

FIG. 9 illustrates a flow chart of a testing method of an embodiment, based on the above-mentioned testing device. With reference to FIG. 9, in the embodiment, the method includes S100 to S300.

In S100, a to-be-tested pulse signal is received.

In S200, a first sampled signal and a second sampled signal are generated according to the pulse signal.

In S300, the first sampled signal and the second sampled signal are obtained, and a width of the pulse signal is obtained according to the first sampled signal and the second sampled signal.

The second sampled signal and the first sampled signal have a phase difference, the phase difference being equal to a pulse width of the pulse signal.

It is to be noted that for specific limitation on the testing method, reference may be made to the above limitation on the testing device, which will not be repeated here.

It is to be understood that although steps of the flow chart in FIG. 9 are shown sequentially as indicated by arrows, the steps are not necessarily performed sequentially as indicated by the arrows. Unless specifically stated otherwise herein, the steps are not performed in a strict order of limitation, and the steps may be performed in other orders. Moreover, at least a part of the steps in the flow chart may include multiple sub steps or stages that are not necessarily performed at the same time, but may be performed at different times, and the steps or stages are not necessarily performed in sequence, but rather may be performed in turns or alternatively with other steps or at least a part of the steps or stages in the other steps.

The technical features of the above embodiments can be combined arbitrarily. In order to make the description concise, all possible combinations of various technical features in the above embodiments are not completely described. However, as long as there is no contradiction in the combination of these technical features, it is to be regarded as the scope of this specification.

The foregoing embodiments only describe several implementations of the disclosure, and their description is specific and detailed, but cannot therefore be understood as a limitation to the patent scope of the disclosure. It is to be noted that those of ordinary skill in the art may further make variations and improvements without departing from the inventive concepts of the embodiments of the disclosure, and these all fall within the protection scope of the embodiments of the disclosure. Therefore, the scope of protection of the patent of the embodiments of the disclosure shall subject to the appended claims.

What is claimed is:

1. A testing circuit, comprising:
   a first sampling module, configured to receive a to-be-tested pulse signal, and generate a first sampled signal according to the to-be-tested pulse signal; and
   a second sampling module, configured to receive the to-be-tested pulse signal, and generate a second sampled signal according to the to-be-tested pulse signal,
   wherein the second sampled signal and the first sampled signal have a phase difference, the phase difference being equal to a pulse width of the to-be-tested pulse signal,
   wherein the first sampling module comprises:
   a first temporary storage unit, configured to sample a first to-be-sampled signal in response to the to-be-tested pulse signal so as to generate a first temporary storage signal, wherein a triggering type of the first temporary storage unit is edge triggering, and an edge of the first temporary storage signal corresponds to a first edge of the to-be-tested pulse signal and corresponds to an edge of the first sampled signal; and
   wherein the second sampling module comprises a transmission gate and a second temporary storage unit.

2. The testing circuit of claim 1, wherein the first sampling module is configured to generate the first sampled signal in response to a falling edge of the to-be-tested pulse signal, and the second sampling module is configured to generate the second sampled signal in response to a rising edge of the to-be-tested pulse signal.

3. The testing circuit of claim 1, wherein a first delay time of the first sampling module on a first transmission path is equal to a second delay time of the second sampling module on a second transmission path.

4. The testing circuit of claim 1, wherein the first temporary storage unit comprises one or more of a trigger, a latch or a register.

5. The testing circuit of claim 1, wherein the first sampling module further comprises:
   a first inverter, wherein the first inverter forms a first feedback loop together with the first temporary storage unit, the first feedback loop is configured to respond to the to-be-tested pulse signal and generate a first feedback signal, and an edge of the first feedback signal corresponds to the first edge of the to-be-tested pulse signal.

6. The testing circuit of claim 5, wherein an input terminal of the first inverter is connected to an output terminal of the first temporary storage unit, an output terminal of the first inverter is connected to an input terminal of the first temporary storage unit, and the first inverter is configured to invert the first temporary storage signal so as to generate the first feedback signal.

7. The testing circuit of claim 6, wherein the first sampling module further comprises:
   a second inverter, wherein an input terminal of the second inverter is connected with the output terminal of the first inverter, and the second inverter is configured to receive the first feedback signal, and generate the first sampled signal according to the first feedback signal.

8. The testing circuit of claim 1, wherein the first sampling module further comprises:
   a third inverter, wherein an input terminal of the third inverter is connected to the to-be-tested pulse signal, an output terminal of the third inverter is connected to a drive terminal of the first temporary storage unit, and the third inverter is configured to receive the to-be-tested pulse signal and output an inverted pulse signal to the first temporary storage unit.

9. The testing circuit of claim 7, wherein the second sampling module further comprises a fourth inverter and a fifth inverter,
   wherein an input terminal of the transmission gate is connected the to-be-tested pulse signal, an output terminal of the transmission gate is connected with a drive terminal of the second temporary storage unit, and the transmission gate is configured to transmit the to-be-tested pulse signal to the second temporary storage unit;
   an input terminal of the second temporary storage unit is connected with an output terminal of the fourth inverter, and the second temporary storage unit is configured to, in response to the to-be-tested pulse signal, sample a signal output by the fourth inverter so as to generate a second temporary storage signal, an edge of the second temporary signal corresponding to a second edge of the to-be-tested pulse signal;
   the fourth inverter is configured to invert the second temporary signal so as to generate a second feedback signal; and
   an input terminal of the fifth inverter is connected with an output terminal of the fourth inverter, and the fifth inverter is configured to receive the second feedback signal, and generate the second sampled signal according to the second feedback signal.

10. The testing circuit of claim 9, wherein the first temporary storage unit is configured to respond to a falling edge, and the second temporary storage unit is configured to respond to a rising edge.

11. The testing circuit of claim 9, wherein the first temporary storage unit and the second temporary storage unit both respond to a rising edge, and the third inverter is arranged in front of the first temporary storage unit.

12. The testing circuit of claim 1, wherein the first sampled signal and the second sampled signal are square wave signals, and have a same signal amplitude, frequency and duty cycle.

13. A testing device, comprising:
    a testing circuit; and
    an analysis circuit, connected with the testing circuit, and configured to obtain a width of a to-be-tested pulse signal according to the first sampled signal and the second sampled signal, wherein the testing circuit comprises:
a first sampling module, configured to receive the to-be-tested pulse signal, and generate a first sampled signal according to the to-be-tested pulse signal; and
a second sampling module, configured to receive the to-be-tested pulse signal, and generate a second sampled signal according to the to-be-tested pulse signal,
wherein the second sampled signal and the first sampled signal have a phase difference, the phase difference being equal to a pulse width of the to-be-tested pulse signal,
wherein the first sampling module comprises:
a first temporary storage unit, configured to sample a first to-be-sampled signal in response to the to-be-tested pulse signal so as to generate a first temporary storage signal, wherein a triggering type of the first temporary storage unit is edge triggering, and an edge of the first temporary storage signal corresponds to a first edge of the to-be-tested pulse signal and corresponds to an edge of the first sampled signal; and
wherein the second sampling module comprises a transmission gate and a second temporary storage unit.

14. A testing method performed by a testing device comprising a first sampling circuit, a second sampling circuit and an analysis circuit, the method comprising:
receiving, by the first sampling circuit and the second sampling circuit, a to-be-tested pulse signal;
generating, by the first sampling circuit and the second sampling circuit, a first sampled signal and a second sampled signal according to the to-be-tested pulse signal respectively; and
obtaining, by the analysis circuit, the first sampled signal and the second sampled signal, and obtaining a width of the to-be-tested pulse signal according to the first sampled signal and the second sampled signal,
wherein the second sampled signal and the first sampled signal have a phase difference, the phase difference being equal to a pulse width of the to-be-tested pulse signal, wherein generating, by the first sampling circuit, the first sampled signal comprises:
sampling, by a first temporary storage unit of the first sampling circuit, a first to-be-sampled signal in response to the to-be-tested pulse signal so as to generate a first temporary storage signal, wherein a triggering type of the first temporary storage unit is edge triggering, and an edge of the first temporary storage signal corresponds to a first edge of the to-be-tested pulse signal; and
outputting, by the first temporary storage unit, the first temporary storage signal as the first sampled signal, and
wherein the second sampling module comprises a transmission gate and a second temporary storage unit.

15. The testing method of claim 14, wherein generating, by the first sampling circuit and the second sampling circuit, the first sampled signal and the second sampled signal according to the to-be-tested pulse signal respectively comprises:
generating, by the first sampling circuit, the first sampled signal in response to a falling edge of the to-be-tested pulse signal, and generating, by the second sampling circuit, the second sampled signal in response to a rising edge of the to-be-tested pulse signal.

16. The testing method of claim 14, wherein a first delay time of the first sampling circuit on a first transmission path is equal to a second delay time of the second sampling circuit on a second transmission path.

17. The testing method of claim 14, wherein the first temporary storage unit comprises one or more of a trigger, a latch or a register.

18. The testing method of claim 14, wherein the first temporary storage signal is inverted by an inverter of the first sampling circuit before being output as the first sampled signal.

* * * * *